(12) United States Patent
Takeuchi et al.

(10) Patent No.: US 10,663,495 B2
(45) Date of Patent: May 26, 2020

(54) AVERAGING UNIT AND MEASURING APPARATUS

(71) Applicant: HIOKI DENKI KABUSHIKI KAISHA, Nagano (JP)

(72) Inventors: Yoichiro Takeuchi, Nagano (JP); Hajime Yoda, Nagano (JP)

(73) Assignee: HIOKI DENKI KABUSHIKI KAISHA, Nagano (JP)

( * ) Notice: Subject to any disclaimer, the term of this patent is extended or adjusted under 35 U.S.C. 154(b) by 271 days.

(21) Appl. No.: 15/204,131

(22) Filed: Jul. 7, 2016

(65) Prior Publication Data

US 2017/0016938 A1     Jan. 19, 2017

(30) Foreign Application Priority Data

Jul. 14, 2015  (JP) ................. 2015-140399

(51) Int. Cl.
*G01R 19/00*     (2006.01)
*G01R 15/08*     (2006.01)

(52) U.S. Cl.
CPC .......... *G01R 19/003* (2013.01); *G01R 15/08* (2013.01); *G01R 19/0092* (2013.01)

(58) Field of Classification Search
CPC ... G01R 19/003; G01R 15/08; G01R 19/0092
USPC ...................................... 324/140
See application file for complete search history.

(56) References Cited

U.S. PATENT DOCUMENTS

| | | | |
|---|---|---|---|
| 6,844,734 B2 | 1/2005 | Fukuda et al. | |
| 7,737,733 B2 | 6/2010 | Yokomizo et al. | |
| 8,310,226 B2 | 11/2012 | Emoto | |
| 2007/0073167 A1* | 3/2007 | Ng | A61B 5/021 600/481 |
| 2009/0167080 A1* | 7/2009 | Carpenter | H02M 3/1584 307/14 |
| 2015/0160271 A1 | 6/2015 | Yoshida et al. | |

FOREIGN PATENT DOCUMENTS

| | | | | |
|---|---|---|---|---|
| CN | 1651923 A | 8/2005 | | |
| CN | 101069343 A | 11/2007 | | |
| CN | 101765779 A | 6/2010 | | |
| JP | S62105055 A | * 5/1987 | ............ | G01R 19/02 |
| JP | H3-239965 | 10/1991 | | |
| JP | H4-090971 | 8/1992 | | |
| JP | 2001-218359 | 8/2001 | | |
| JP | 2001-255339 | 9/2001 | | |

(Continued)

OTHER PUBLICATIONS

Espacenet Translate Oda Minoru JPS62105055A May 1987.*

(Continued)

*Primary Examiner* — Melissa J Koval
*Assistant Examiner* — Courtney G McDonnough
(74) *Attorney, Agent, or Firm* — Greenblum & Bernstein, P.L.C.

(57) ABSTRACT

An averaging unit includes: a plurality of sensor connectors to which current sensors are detachably connected; an averager that generates an averaged signal for at least two detection voltage signals outputted from the current sensors connected to the sensor connectors; and an outputter that outputs the averaged signal.

13 Claims, 4 Drawing Sheets

(56) References Cited

FOREIGN PATENT DOCUMENTS

| | | |
|---|---|---|
| JP | 2010-25889 A | 2/2010 |
| JP | 2015-14525 A | 1/2015 |

OTHER PUBLICATIONS

Notification of Reasons for Refusal (including English language translation), dated Feb. 19, 2019 by the Japan Patent Office (JPO), in Japanese Patent Application No. 2015-140399.
Official Action in Japanese Patent Application No. 2015-140399, dated Aug. 20, 2019 (including English language machine translation).
Official Action in Chinese Patent Application No. 201610547401.8, dated Jun. 5, 2019, including English language machine translation.
Official Action in Chinese Patent Application No. 201610547401.8, dated Feb. 19, 2020.
Decision of Rejection in Japanese Patent Application No. 2015-140399, dated Mar. 3, 2020.

\* cited by examiner

F I G. 3

| TTYPE OF CURRENT PROBE 2 (MEASUREMENT RANGE Irg) | RANGE INFORMATION Dr | |
| --- | --- | --- |
| | PN4 | PN5 |
| CURARENT PROBE 2a (100[A]) | L | L |
| CURARENT PROBE 2b (200[A]) | H | L |
| CURARENT PROBE 2c (500[A]) | L | H |
| CURARENT PROBE 2d (1000[A]) | H | H |

# AVERAGING UNIT AND MEASURING APPARATUS

FIELD OF THE INVENTION

The present invention relates to an averaging unit, which is used in a measuring apparatus for measuring current flowing on a single current path, and a measuring apparatus equipped with such averaging unit.

DESCRIPTION OF THE RELATED ART

A conventional measuring apparatus, such as the measuring apparatus disclosed in Japanese Laid-open Patent Publication No. 2015-14525 proposed by the present applicant, is equipped with a plurality of input units (input connectors as probe connecting units) which are each capable of connecting to one out of a plurality of current probes equipped with current sensors, A/D convertor units that are disposed corresponding to the plurality of input units and perform A/D conversion on the detection signal outputted from a current probe (that is, the signal outputted from a current sensor) connected to the corresponding input unit and output waveform data, a signal adding unit that adds the waveform data outputted from the respective A/D convertor units, and a processing unit that processes the added waveform data outputted from the signal adding unit.

With this measuring apparatus, the plurality of current probes are attached to the same measured wire (current path) and the processing unit executes processing that calculates a current value of the measured current flowing in a single measured wire based on the waveform data produced by adding the waveform data for the detection signals outputted from the respective current probes. In this way, with a measuring apparatus equipped with a plurality of input units that are capable of being individually connected to a plurality of current probes, a configuration where an A/D convertor unit is separately provided for each input unit is normally used.

SUMMARY OF THE INVENTION

However, with a measuring apparatus equipped with a function that adds waveform data for detection signals outputted from current probes connected to the input units, such as the measuring apparatus disclosed in the cited patent document, or as shown in FIG. 4 with a measuring apparatus 51 equipped with a plurality of input systems (i.e., input systems including input units 52a to 52d (hereinafter also referred to as the "input units 52"), to which current probes 2 with current sensors I1 are connected and A/D convertor units 53a to 53d (hereinafter also referred to as the "A/D convertor units 53") that convert the detection voltage signals S1 (in the present example, the detection voltage signals S1a to S1d) outputted from the current probes 2 via the input units 52 to waveform data Di (in the present embodiment, the waveform data Dia to Did)), even when the current value I1 of the measured current I flowing in one measured wire 6 (current path) exceeds the measurement range of a current probe 2, it is possible to measure the current value I1 by dividing the measured wire 6 into a plurality of branch paths.

For example, when the current value I1 of the measured current I is 1200 A and the measurement range of each current probe 2 is 500 A, since 1200 A is over two times but less than three times 500 A, as shown in FIG. 4, the measured wire 6 is divided into a plurality of (that is, three) branch paths 6a, 6b, and 6c. Also, the current probes 2 are connected to an equal number of input units 52 in the measuring apparatus 1 to the number of branch paths 6a, 6b, and 6c (as one example, for the measuring apparatus 1 in FIG. 4, the three input units 52a, 52b, and 52c out of the four input units 52a, 52b, 52c, and 52d) and the current probes 2 are individually attached to the branch paths 6a, 6b, and 6c.

By doing so, in the measuring apparatus 1, out of the four input systems (an input system including the input unit 52a and the A/D convertor unit 53a, an input system including the input unit 52b and the A/D convertor unit 53b, an input system including the input unit 52c and the A/D convertor unit 53c, and an input system including the input unit 52d and the A/D convertor unit 53d), three input systems (as one example, the three input systems aside from the input system including the input unit 52d and the A/D convertor unit 53d) are used and the respective A/D convertor units 53 (that is, the A/D convertor units 53a, 53b, and 53c) are capable of correctly converting the detection voltage signals S1 (the detection voltage signals S1a, S1b, and S1c outputted from the current sensors 11 of the current probes 2) inputted from the corresponding input units 52a, 52b, and 52c to the waveform data Di (the waveform data Dia, Dib, and Dic) while avoiding saturation. Accordingly, the processing unit 54 is capable of adding correct waveform data Dia, Dib, and Dic and calculating the current value I1 (=Ia1+Ib1+Ic1) of the measured current I based on the added waveform data Dad (=Dia+Dib+Dic) obtained by the addition and information on the measurement range of the current probes 2.

However, with a configuration where the current probes 2 are connected to the plurality of input units 52 and the measured current I of a single measured wire 6 is measured using a plurality of current probes 2, since a plurality of A/D convertor units 53 are used on the measuring apparatus 51 side to measure the measured current I of a single measured wire 6, there is a drop in the number of input units 52 (that is, the number of the A/D convertor units 53) that can be used for measurement aside from measurement of the measured current I. Accordingly, there is a problem to be solved in that depending on the extent of the drop in available units, it may become difficult to measure the voltage of the measured wire 6 using voltage probes at the same time as measurement of the measured current I and/or to measure power supplied via the measured wire 6 based on the measured current and voltage.

The present invention was conceived in view of the above problem and has a principal object of providing an averaging unit capable of enabling a measuring apparatus (measuring apparatus main unit) to measure a measured current with a current value that exceeds a measurement range of a current probe (i.e., that exceeds a current value that can be measured by a current probe) while minimizing the number of used input units (that is, sensor connectors to which current probes (that is, current sensors) are connected) provided in the measuring apparatus (measuring apparatus main unit), and providing a measuring apparatus including such averaging unit.

To achieve the stated object, an averaging unit comprises a plurality of sensor connectors to which current sensors are detachably connected; an averager that generates an averaged signal for at least two detection voltage signals outputted from the current sensors connected to the sensor connectors; and an outputter that outputs the averaged signal.

Also, the measuring apparatus to the present invention comprises the averaging unit according to the present invention one inputter that is connected to the outputter of the averaging unit and inputs the averaged signal; an A/D convertor that carries out A/D conversion on the averaged signal outputted from the inputter and outputs averaged data; and a processor, wherein the processor executes a calculating process that calculates, based on the averaged data, a current value of a combined current produced by combining currents flowing on at least two current paths to which the current sensors have been attached.

Accordingly, with the averaging unit according to the present invention, as one example, by connecting the outputter to one inputter of the measuring apparatus main unit that includes an A/D convertor, a processor, and the like, it is possible to have the processor measure a measured current (i.e., the current flowing on a current path) with a current value that exceeds the measurement range of a current sensor using a method of measuring that branches the current path on which the measured current is flowing into a plurality of other current paths, while suppressing the used number of inputters provided in the measuring apparatus main unit to a minimum (i.e., one).

By doing so, according to a measuring apparatus according to the present invention equipped with the averaging unit according to the present invention, by making use of remaining input units and connecting a voltage probe or other current probe to such input units while the processor measures the current value of a measured current flowing on a current path based on averaged data using a method that measures by branching the current path on which the measured current flows into a plurality of other current paths, it is possible as examples to have the processor measure the voltage value of a voltage applied to a current path using such voltage probe and/or simultaneously have the processor measure power or the like supplied via the current path based on the measured current value and the voltage value.

Also, the averaging unit to the present invention outputs number information showing a number of the sensor connectors to which the current sensors are connected.

Also, the measuring apparatus to the present invention comprises the averaging unit according to the present invention; one inputter that is connected to the outputter of the averaging unit and inputs the averaged signal; an A/D convertor that carries out A/D conversion on the averaged signal outputted from the inputter and outputs averaged data; and a processor, wherein the processor executes a calculating process that calculates, based on the averaged data and the number information, a current value of a combined current produced by combining currents flowing on at least two current paths to which the current sensors have been attached.

According to the averaging unit according to the present invention, it is possible to have number information showing the number of sensor connectors to which current sensors are connected automatically outputted to the processor. By doing so, according to a measuring apparatus according to the present invention equipped with the averaging unit according to the present invention, in a state where the range information of the current sensors is known to the processor, it is possible to measure the current value of the current flowing on a current path based on an averaged signal (averaged data), the number information, and the known range information, while omitting the burden of manually inputting the number information into the processor. According to this measuring apparatus, by making use of remaining input units and connecting a voltage probe or other current probe to such input units while the processor measures the current value of a measured current flowing on a current path based on averaged data using a method that measures by branching the current path on which the measured current flows into a plurality of other current paths, it is possible as examples to have the processor measure the voltage value of a voltage applied to a current path using such voltage probe and/or simultaneously have the processor measure power or the like supplied via the current path based on the measured current value and the voltage value.

Also, the averaging unit according to the present invention outputs range information showing a measurement range of the current sensors connected to the sensor connectors.

Also, the measuring apparatus according to the present invention comprises the averaging unit according to claim 3; one inputter that is connected to the outputter of the averaging unit and inputs the averaged signal; an A/D convertor that carries out A/D conversion on the averaged signal outputted from the inputter and outputs averaged data; and a processor, wherein the processor executes a calculating process that calculates, based on the averaged data and the range information, a current value of a combined current produced by combining currents flowing on at least two current paths to which the current sensors have been attached.

According to the averaging unit according to the present invention, it is possible to have range information for the current sensors connected to the sensor connectors automatically outputted to the processor. By doing so, according to a measuring apparatus according to the present invention equipped with the averaging unit according to the present invention, in a state where the number of current sensors connected to the averaging unit is known to the processor, it is possible to measure the current value of the current flowing on a current path based on an averaged signal (averaged data), the range information, and the known number of current sensors, while omitting the burden of manually inputting the range information into the processor. According to this measuring apparatus, by making use of remaining input units and connecting a voltage probe or other current probe to such input units while the processor measures the current value of a current flowing on a current path based on averaged data using a method that measures by branching the current path on which the measure current flows into a plurality of other current paths, it is possible as examples to have the processor measure the voltage value of a voltage applied to a current path using such voltage probe and/or simultaneously have the processor measure power or the like supplied via the current path based on the measured current value and the voltage value.

Also, the averaging device to the present invention, wherein input resistors that set an input impedance for the current sensors are connected to the sensor connectors, the averager includes: a buffer unit including an input terminal set at a high input impedance and an output terminal that is connected to the outputter; and an equal number of voltage dividing resistors to the sensor connectors, each voltage dividing resistor being set at the same resistance value and being connected between a corresponding sensor connector and the input terminal, and at least one voltage dividing resistor out of the voltage dividing resistors is connected between the sensor connector and the input terminal in a state where the voltage dividing resistor is connected in series to a switch and other voltage dividing resistors aside from the at least one voltage dividing resistor are connected between the sensor connector and the input terminal in a solitary state.

According to the averaging unit according to the present invention, even when current sensors are always connected to sensor connectors for which the voltage dividing resistors are connected in a solitary state and current sensors are connected as necessary to the sensor connectors for which the voltage dividing resistors are connected having been connected in series to switches, it is possible, by switching the corresponding switch to the off state, to separate a voltage dividing resistor and an input resistor to which a current sensor is not connected (that is, into which a detection voltage signal is not inputted) from the voltage dividing resistors and the input resistors to which current sensors are connected (that is, into which detection voltage signals are inputted). This means that it is possible, with a simple configuration, to correctly generate an averaged signal for detection voltage signals that are inputted from current sensors into the averaging unit.

It should be noted that the disclosure of the present invention relates to the contents of Japanese Patent Application 2015-140399 that was filed on Jul. 14, 2015, the entire contents of which are herein incorporated by reference.

BRIEF DESCRIPTION OF THE DRAWINGS

These and other objects and features of the present invention will be explained in more detail below with reference to the attached drawings, wherein:

FIG. 3 is a diagram useful in explaining the correspondence between types of current probes and their respective range information Dr.

DESCRIPTION OF THE PREFERRED EMBODIMENTS

Preferred embodiments of an averaging unit and a measuring apparatus equipped with such averaging unit will be described below with reference to the drawings.

First, the configuration of the averaging unit and the measuring apparatus will be described with reference to the drawings.

Figure 1:
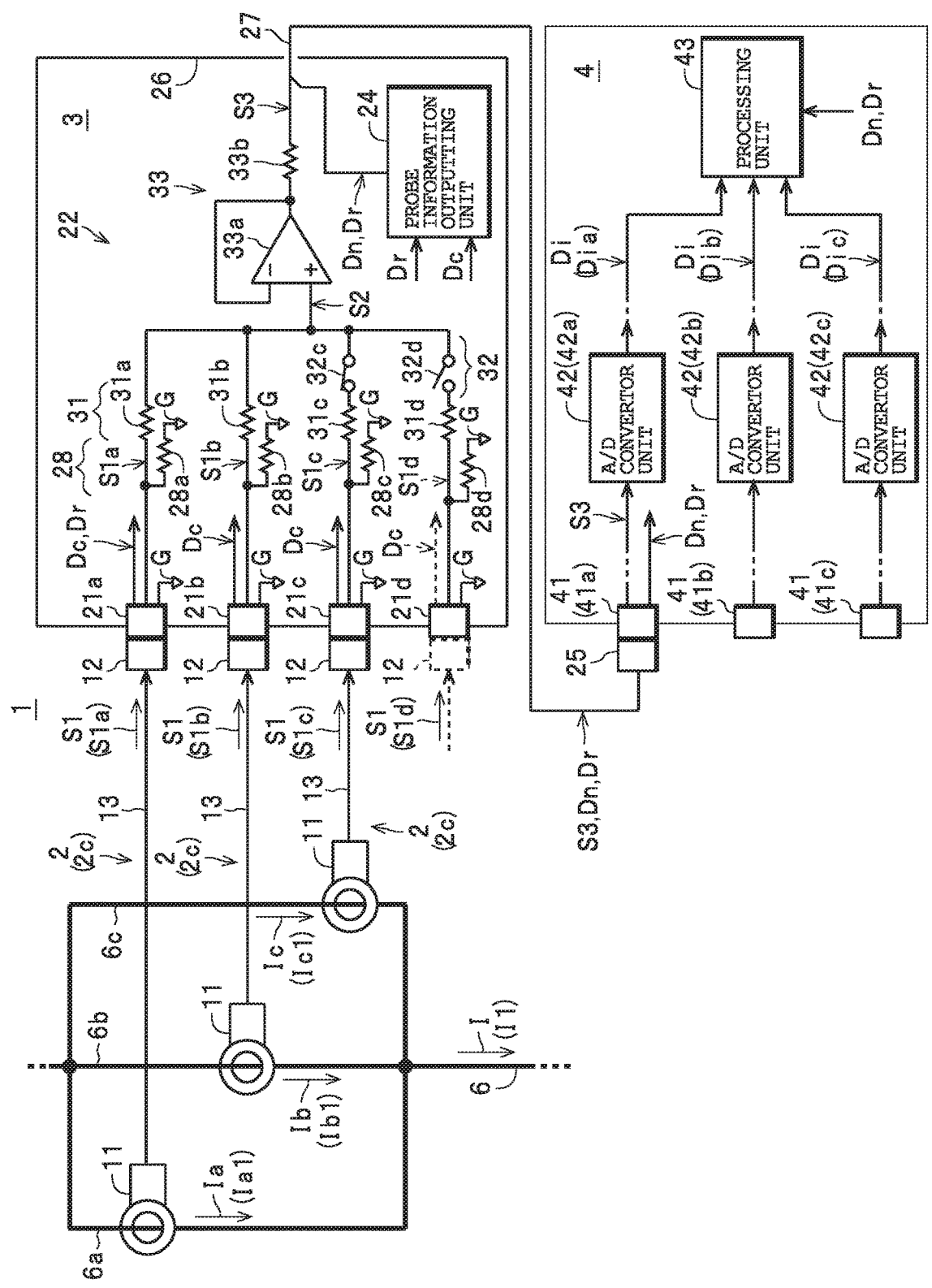
FIG. 1 is a block diagram of a measuring apparatus including current probes, an averaging unit, and a measuring apparatus main unit.

A measuring apparatus 1 as the measuring apparatus depicted in FIG. 1 includes a plurality of current probes 2 (current probes with the same measurement range Irg), an averaging unit 3 as the averaging unit, and a measuring apparatus main unit 4, and is configured so as to be capable of measuring the current value I1 of the measured current I as an AC current flowing in the measured wire 6 as a single current path in a state where the measured wire 6 is branched into branch paths as a plurality of current paths (as one example in FIG. 1, three measured wire 6a, 6b, and 6c). Here, the expression "measurement range Irg" refers to the maximum value of the rated current of the current probes 2, and as examples, when the maximum value is 200 A, the measurement range Irg is also 200 A, while when the maximum value is 500 A, the measurement range Irg is also 500 A.

It is assumed that the current probes 2 include a variety of types (as one example in the present embodiment, four types composed of a current probe 2a with a measurement range Irg of 100 A, a current probe 2b with a measurement range Irg of 200 A, a current probe 2c with a measurement range Irg of 500 A, and a current probe 2d with a measurement range Irg of 1000 A, hereinafter collectively referred to as the "current probes 2" when no distinction is required). The respective current probes 2 each include a current sensor 11 configured so as to be capable of clamping a wire (i.e., of being attached to a wire), a probe connecting portion (a connector with the same arrangement of pins as a sensor connecting portions (a connector with a plurality of connection pins) 21a to 21d, described later, of the averaging unit 3) 12 that can be detachably attached to one of the sensor connecting portions 21a to 21d (hereinafter collectively referred to as the "sensor connectors 21" when no distinction is required), and a cable 13 that connects the current sensor 11 and the probe connecting portion 12. The cable 13 is composed of a shielded cable where a wire for transferring signals is covered with a shield member, as with a coaxial cable or the like.

Figure 2:
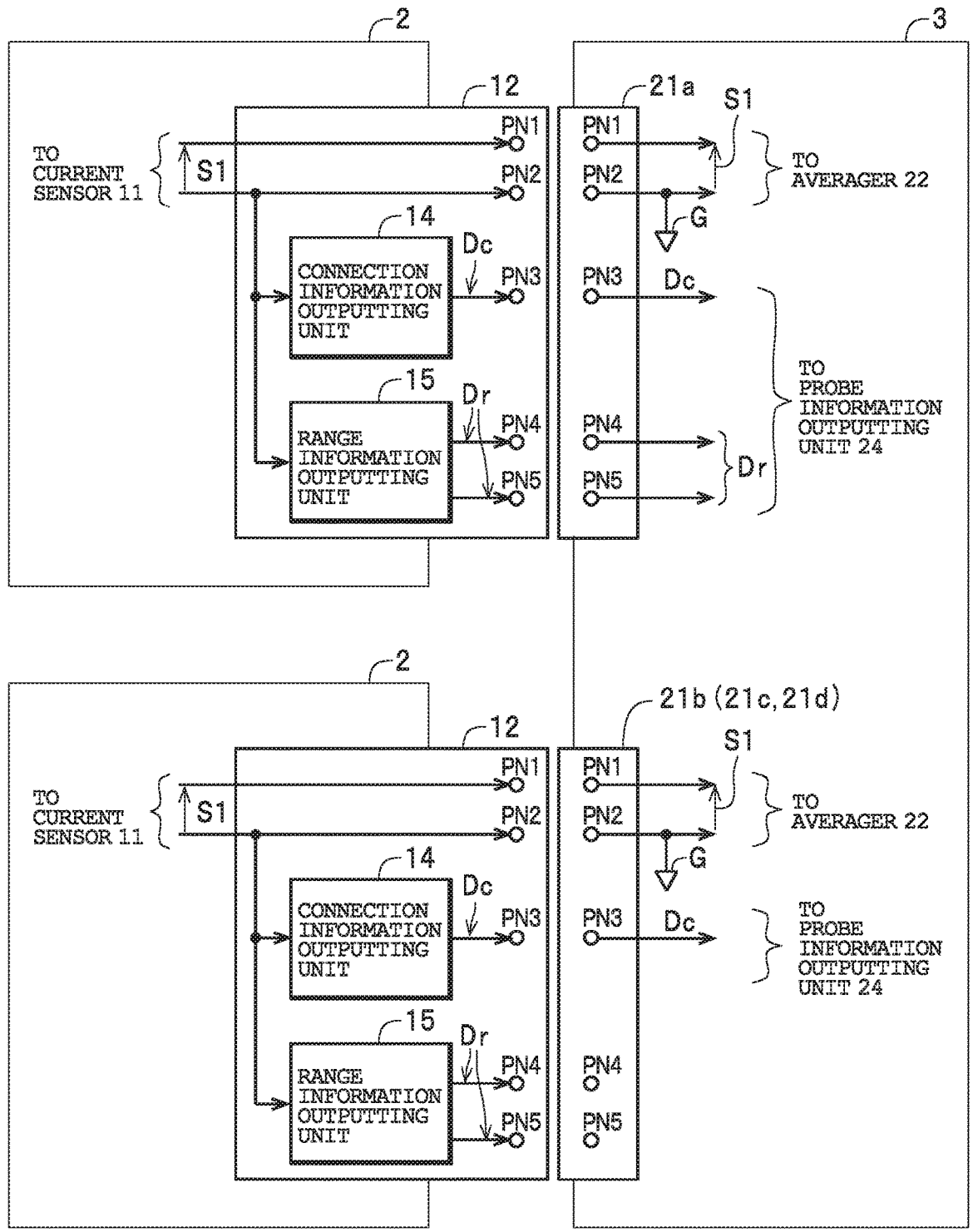
FIG. 2 is a block diagram useful in explaining probe connecting portions of the current probes depicted in FIG. 1.
Figure 4:
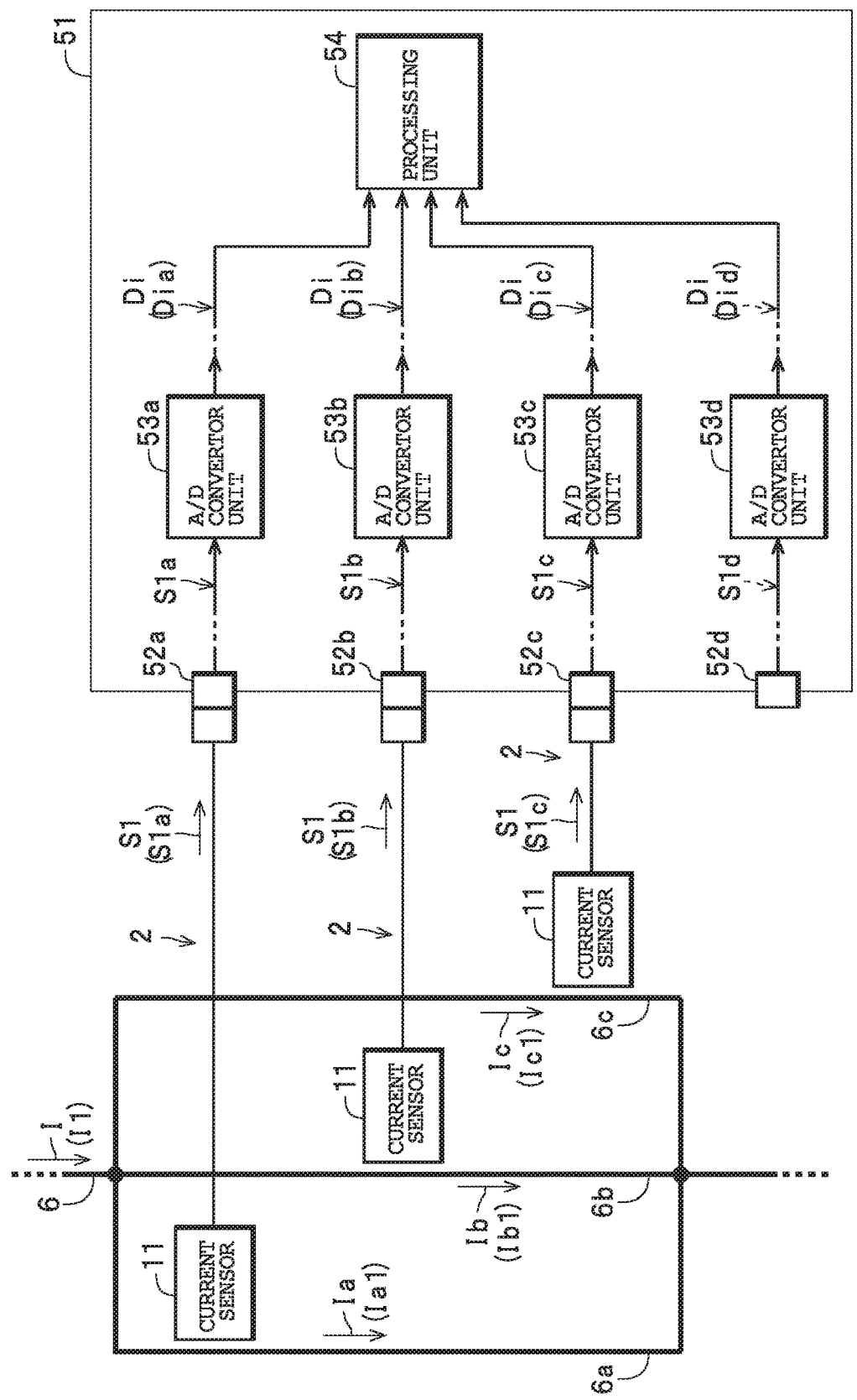
FIG. 4 is a block diagram of a conventional measuring apparatus.

The current sensor 11 operates on a driving voltage, not illustrated, supplied via the cable 13 from the averaging unit 3, and, in addition to detecting the current flowing in the clamped wire, outputs the detection voltage signal S1 (as examples in the present embodiment, the detection voltage signals S1a to S1d) that is a voltage signal whose amplitude changes in proportion to the current value of the detected current (that is, an analog voltage signal whose amplitude changes with a reference voltage (ground voltage) G of the driving voltage described above as a reference) with a low impedance (as one example, an output impedance of around 50Ω) via the cable 13 to the averaging unit 3. As one example in the present embodiment, as depicted in FIG. 2, the detection voltage signal S1 is outputted from a connection pin PN1 of the probe connecting portion 12 to a corresponding connection pin PN1 of a sensor connector 21 of the averaging unit 3. As depicted in FIG. 2, the shield member of the cable 13 that shields the wire used to transmit the detection voltage signal S1 inside the cable 13, or a wire that forms a return path for the detection voltage signal S1 is connected to a connection pin PN2 of the probe connecting portion 12 and is thereby connected, via the corresponding connection pin PN2 of the sensor connector 21 of the averaging unit 3, to the reference voltage G for the driving voltage described above of the averaging unit 3.

A connection information outputting unit 14 and a range information outputting unit 15 are also incorporated in the current sensor 11 or the probe connecting portion 12 (as one example in the present embodiment, in the probe connecting portion 12 as depicted in FIG. 2). Here, when the probe connecting portion 12 is connected to a sensor connector 21 of an averaging unit 3, the connection information outputting unit 14 outputs connection information (connection data) Dc, which shows that the probe connecting portion 12 is connected to such sensor connector 21, via a predetermined connection pin of the probe connecting portion 12 (as one example in the present embodiment, the single connection pin PN3) to a corresponding connection pin of the sensor connector 21 (in the present embodiment, the connection pin PN3), more specifically, the connection pin PN3, to a probe information outputting unit 24, described later, of the averaging unit 3. As one example in the present embodiment, in a state (or "connected state") where the probe connecting portion 12 is connected to a sensor connector 21, the connection information outputting unit 14 outputs a voltage (a low level voltage (voltage L)) that is substantially equal to the reference voltage G to the connection pin PN3 of the probe connecting portion 12 and to the connection pin PN3 of the sensor connector 21 that is connected to such connection pin PN3, while in a state (or "unconnected state") where the probe connecting portion 12 is not connected to a sensor connector 21, the connection information outputting unit 14 outputs a voltage (a high level voltage (voltage H)) that is substantially equal to the driving voltage to the connection pin PN3 of the probe connecting portion 12 and to the connection pin PN3 of the sensor connector 21 that is connected to such connection pin PN3.

When the probe connecting portion 12 is connected to a sensor connector 21 of the averaging unit 3, the range information outputting unit 15 outputs range information (range data) Dr showing the type of current probe 2 (that is, the measurement range of the connected current probe 2) connected to the sensor connector 21 via predetermined connection pins of the probe connecting portion 12 (as one example in the present embodiment, two connection pins PN4 and PN5) to corresponding connection pins (in the present embodiment, the connection pins PN4 and PN5) of the sensor connector 21, more specifically the connection pins PN4 and PN5, to the probe information outputting unit 24 in the averaging unit 3. In the present embodiment, as described above, there are four types of current probes 2 with a measurement range Irg of 100 A, a measurement range Irg of 200 A, a measurement range Irg of 500 A, and a measurement range Irg of 1000 A. For this reason, in the present embodiment, the range information Dr for identifying the four types is configured as two-bit information, with the respective bits of information being outputted to the connection pins PN4 and PN5.

As examples in the present embodiment, as depicted in FIG. 3, the range information outputting unit 15 provided in the probe connecting portion 12 of the current probe 2a with the measurement range Irg of 100 A outputs the range information Dr (voltages L,L) to the connection pins PN4 and PN5, the range information outputting unit 15 provided in the probe connecting portion 12 of the current probe 2b with the measurement range Irg of 200 A outputs the range information Dr (voltages H,L) to the connection pins PN4 and PN5, the range information outputting unit 15 provided in the probe connecting portion 12 of the current probe 2c with the measurement range Irg of 500 A outputs the range information Dr (voltages L,H) to the connection pins PN4 and PN5, and the range information outputting unit 15 provided in the probe connecting portion 12 of the current probe 2d with the measurement range Irg of 1000 A outputs the range information Dr (voltages H,H) to the connection pins PN4 and PN5.

When, as one example, a configuration is used where input terminals of an input buffer of the probe information outputting unit 24 that input the connection information Dc and the range information Dr are pulled up by the averaging unit 3 via a resistor to the driving voltage (the voltage H), the connection information outputting unit 14 that outputs the connection information Dc and the range information outputting unit 15 that outputs the range information Dr as described above can be easily configured using dipswitches or the like that can be arbitrarily switched on and off independently of the connections between the connection pins PN3, PN4, and PN5 and the connection pin PN2 (i.e., a pin set at the reference voltage G). With this configuration, when the probe connecting portion 12 is connected to a sensor connector 21 of the averaging unit 3, connection pins out of the connection pins PN3, PN4, and PN5 that have an "on" connection to the connection pin PN2 (the "connected state") due to the dipswitches are set at the voltage L (a state where the voltage L is outputted) and connection pins that have an "off" connection with the connection pin PN2 (a "unconnected state") due to the dipswitches are set at the voltage H (a state where the voltage H is outputted).

As one example, as depicted in FIG. 1, the averaging unit 3 includes a plurality of sensor connecting portions (sensor connectors) 21, an averager 22, the probe information outputting unit 24 (which is also a sensor information outputting unit), one output unit 25, and input resistors 28, with the component elements aside from the output unit 25 being disposed in a main case 26 (an adapter made of synthetic resin) and the output unit 25 is disposed at the end of a cable 27 that extends from inside the main case 26.

More specifically, in the present embodiment, the sensor connectors 21 are composed of four sensor connectors 21a, 21b, 21c, and 21d (hereinafter collectively referred to as the "sensor connectors 21" when no distinction is required) as one example of a "plurality of sensor connectors 21". Each sensor connector 21 is composed of a connector with the same pin arrangement as the probe connecting portions 12 of the current probes 2. By using this configuration, in the connected state where probe connecting portions 12 are connected as depicted in FIG. 2, the respective connection pins PN1 of the sensor connectors 21a, 21b, 21c, and 21d are connected to the connection pins PN1 of the probe connecting portions 12 so that the detection voltage signals S1 inputted from the connection pins PN1 of the probe connecting portions 12 are outputted to the averager 22. In the connected state, the connection pins PN2 of the sensor connectors 21a, 21b, 21c, and 21d that are connected to the reference voltage G are connected to the connection pins PN2 of the probe connecting portions 12. Also, in the connected state, the connection pins PN3 of the sensor connectors 21a, 21b, 21c, and 21d are connected to the connection pins PN3 of the probe connecting portions 12 so that the connection information Dc inputted from the connection pins PN3 of the probe connecting portions 12 are outputted to the probe information outputting unit 24. Input resistors 28a, 28b, 28c, and 28d (hereinafter collectively referred to as the "input resistors 28" when no distinction is required) with the same resistance values (as one example, 1 MΩ) are connected (disposed) between the reference voltage G and the connection pins PN1 of the sensor connectors 21a, 21b, 21c, and 21d. By doing so, the input impedance for the current sensors 11 (that is, the current probes 2), and more specifically the input impedance for the detection voltage signals S1 outputted from the current sensors 11 is set at the resistance value of the input resistors 28.

In particular, in a state where the averaging unit 3 is being used (that is, a measurement state where the measured wire 6 is divided into a plurality of branch paths), the current probes 2 will always be connected to two sensor connectors 21a and 21b out of the sensor connectors 21a, 21b, 21c, and 21d, with the connection pins PN4 and PN5 of one out of such sensor connectors 21a and 21b (as one example in the present embodiment, the sensor connector 21a) being connected to at least the probe information outputting unit 24. Accordingly, in the connected state described above, as depicted in FIG. 2, the connection pins PN4 and PN5 of the sensor connector 21a are connected to the connection pins PN4 and PN5 of the probe connecting portion 12, which means that the range information Dr inputted from the connection pins PN4 and PN5 of such probe connecting portion 12 is outputted to the probe information outputting unit 24.

As one example, as depicted in FIG. 1, the averager 22 inputs the detection voltage signals S1 outputted from the current sensors 11 of the current probes 2 connected to two or more sensor connectors 21 and generates an averaged signal S3 for such plurality of detection voltage signals S1.

As one example in the present embodiment, as depicted in FIG. 1, the averager 22 includes an equal number of voltage dividing resistors 31 to the plurality of sensor connectors 21, a number of on/off switches 32 (in the present embodiment, the on/off switches 32c and 32d) that is equal to the number of other sensor connectors 21 (in the present embodiment, the two sensor connectors 21c and 21d) out of the sensor connectors 21a, 21b, 21c, and 21d aside from the two sensor connectors 21a and 21b that are always connected to current probes 2, and a buffer unit 33 that has an input terminal set at a high input impedance and an output terminal connected to the output unit 25 (in the present embodiment, connected via the cable 27).

More specifically, since there are four sensor connectors 21 in the present embodiment, the averager 22 has four voltage dividing resistors 31a, 31b, 31c, and 31d as the voltage dividing resistors 31 and the respective voltage dividing resistors 31 are set at the same resistance value (a resistance value that is sufficiently higher than the output impedance of the current probes 2 (in the present embodiment, 50Ω), and as one example in the present embodiment, 10 kΩ). The voltage dividing resistors 31 are each connected between the connection pin PN1 of the corresponding sensor connectors 21 and an input terminal of the buffer unit 33 (more specifically, a non-inverting input terminal of an operational amplifier 33a, described later that constructs the buffer unit 33).

Out of the voltage dividing resistors 31, the two voltage dividing resistors 31a and 31b connected to the two sensor connectors 21a and 21b to which current probes 2 are always connected are each connected in a solitary state (i.e., with no other component such as a switch) between the connection pin PN1 of the corresponding sensor connector 21 and the input terminal (the non-inverting input terminal of the operational amplifier 33a) of the buffer unit 33. Also, out of the voltage dividing resistors 31, the voltage dividing resistors 31 (in the present embodiment, the two voltage dividing resistors 31c and 31d) connected to the other sensor connectors 21 aside from the two sensor connectors 21a and 21b (in the present embodiment, the two sensor connectors 21c and 21d) are each connected between the connection pin PN1 of the corresponding sensor connector 21 and an input terminal of the buffer unit 33 (the non-inverting input terminal of the operational amplifier 33a) having been connected in series with the on/off switches 32 (a state where the voltage dividing resistor 31c is connected in series with the on/off switch 32c and the voltage dividing resistor 31d is connected in series with the on/off switch 32d). In this case, as depicted in FIG. 1, although a configuration is used where the voltage dividing resistors 31 and the on/off switches 32 are connected in that order in series between the connection pins PN1 of the sensor connectors 21 and the input terminal of the buffer unit 33, although not illustrated, it is also possible to connect such components in series in reverse order, that is, the on/off switches 32 and the voltage dividing resistors 31. The on/off switches 32c and 32d are composed of switches that can be manually operated from outside the main case 26 (as one example, toggle switches disposed on the main case 26 so that operation levers protrude from the main case 26).

With this configuration, the other ends of the voltage dividing resistors 31 that are set at the same resistance value (i.e., when the on/off switches 32 for the voltage dividing resistors 31c and 31d are in the on state) are commonly connected (collectively connected) to a terminal with an extremely large input impedance (a terminal for which the resistance connected to the terminal can be regarded as being equivalent to only the respective voltage dividing resistors 31), such as an input terminal (the non-inverting input terminal) of the buffer unit 33. This means that based on Thevenin's theorem, the voltage dividing resistors 31 generate an averaged signal S2 for the detection voltage signals S1 inputted into the connection pins PN1 of the plurality of (two or more) sensor connectors 21 (at least the two sensor connectors 21a and 21b) and output such averaged signal S2 to the non-inverting input terminal of the operational amplifier 33a.

As one example, current probes 2 are respectively connected to the sensor connectors 21a and 21b, and when the detection voltage signal S1a (for ease of understanding the present invention, the amplitude of the signal S1a is also expressed as "S1a", with this also applying to the other signals S1b to S1d described later) for the detection voltage signal S1 from the current sensor 11 of the current probe 2 connected to the sensor connector 21a is inputted into the averaging unit 3 and the detection voltage signal S1b as the detection voltage signal S1 from the current sensor 11 of the current probe 2 connected to the sensor connector 21b are inputted into the averaging unit 3, the averager 22 generates, in a state where the on/off switches 32c and 32d are switched to the off state and the voltage dividing resistor 31c and the input resistor 28c connected to the voltage dividing resistor 31c and the voltage dividing resistor 31d and the input resistor 28d connected to the voltage dividing resistor 31d are cut off from the non-inverting input terminal of the operational amplifier 33a, the averaged signal S2(=(S1a+S1b)/2) for the detection voltage signals S1 by dividing the sum of the amplitudes S1a and S1b by the number of detection voltage signals S1. As another example, when current probes 2 are connected to all of the sensor connectors 21a, 21b, 21c, and 21d, the averager 22 generates, in a state where the on/off switches 32c and 32d are switched to the on state and the voltage dividing resistor 31c and the input resistor 28c connected to the voltage dividing resistor 31c and the voltage dividing resistor 31d and the input resistor 28d connected to the voltage dividing resistor 31d are connected to the non-inverting input terminal of the operational amplifier 33a, the averaged signal S2(=(S1a+S1b+S1c+S1d)/4) for the detection voltage signals S1 by dividing the sum of the amplitudes S1a, S1b, S1c, and S1d by the number of detection voltage signals S1.

As one example in the present embodiment, the buffer unit 33 is equipped with the operational amplifier 33a whose inverting input terminal is connected to the output terminal (it is possible to use a configuration where the terminals are directly connected or a configuration where the terminals are connected via a resistor) to form a voltage follower circuit and an output resistor 33b that has a low resistance value (for example, around 50Ω) and is connected in series with the output terminal of the operational amplifier 33a. With this configuration, the buffer unit 33 inputs the averaged signal S2 inputted into the non-inverting input terminal of the operational amplifier 33a with a high impedance and outputs as a new averaged signal S3 with the same amplitude with a low output impedance.

The probe information outputting unit 24 inputs the connection information Dc outputted from each sensor connector 21 and, based on such connection information Dc, outputs number information (number data) Dn showing the number of sensor connectors 21 to which current sensors 11 (that is, current probes 2) are connected. More specifically, since as described above, the connected state where a current probe 2 is connected to a sensor connector 21 is indicated when the connection information Dc outputted from such sensor connectors 21 is the voltage L and the unconnected state where a current probe 2 is not connected to such sensor connector 21 is indicated when the connection information Dc is the voltage H, the probe information outputting unit 24 outputs the total number of connection information Dc with the voltage L as the number information Dn.

The probe information outputting unit 24 also inputs the range information Dr outputted from the sensor connector 21a and, based on the range information Dr, outputs range information showing the measurement range Irg (the measurement range Irg of the current probes 2) of the current sensor 11 connected to each sensor connector 21. In the present embodiment, the probe information outputting unit 24 outputs the inputted range information Dr without amendment as the range data.

The output unit 25 is composed of a connector that is detachably connected to an input unit 41, described later, of the measuring apparatus main unit 4 (as one example in the present embodiment, three input units 41a to 41c: connectors including a plurality of connection pins), that is, the detection electrode 23 is a connector with the same arrangement of pins as the input units 41, and is connected to the main case 26 via the cable 27. In the present embodiment, the current probes 2 that are connected to the sensor connectors 21 of the averaging unit 3 are configured so as to also be connectable to the input units 41 of the measuring apparatus main unit 4. To do so, the sensor connectors 21 of the averaging unit 3 are constructed of the same connectors as the input units 41 of the measuring apparatus main unit 4 and the output unit 25 is constructed of the same connector as the probe connecting portion 12 of a current probe 2. The averaged signal S3, the number information Dn, and the range information Dr are transferred from the main case 26 via the cable 27 to the output unit 25.

The measuring apparatus main unit 4 is equipped with a plurality of input systems that each have an input unit 41 and an A/D convertor unit 42 that converts an analog signal inputted via the input unit 41 to waveform data Di (as one example in the present embodiment, as depicted in FIG. 1, in keeping with the number (three) of input units 41a to 41c, an input system including the input unit 41a and the A/D convertor unit 42a, an input system including the input unit 41b and the A/D convertor unit 42b, and an input system including the input unit 41c and the A/D convertor unit 42c), a processing unit 43 that executes a measurement process that measures the current value of a current and/or the voltage value of a voltage detected by detection probes (the current probes 2 or voltage probes or the like, not illustrated) connected to the input units 41a, 41b, and 41c of the respective systems based on the waveform data Dia, Dib, and Dic outputted from the A/D convertor units 42a, 42b, and 42c of the respective systems, and an operation unit and a display unit, not illustrated. In this case, the processing unit 43 is constructed of a computer, the operation unit is constructed of a touch panel, panel switches, and/or a keyboard, and the display unit is constructed of a display apparatus.

Next, a measurement operation for the current value I1 of the measured current I by the measuring apparatus 1 will be described together with the operation of the averaging unit 3. Note that it is assumed that the measured wire 6 in which the measured current I is flowing has been branched in advance to branch paths as a plurality of current paths (as one example in the present embodiment, the three branch paths 6a, 6b, and 6c).

First, out of the four types of current probe 2, that is, the current probe 2a (measurement range Irg: 100 A), the current probe 2b (measurement range Irg: 200 A), the current probe 2c (measurement range Irg: 500 A), and the current probe 2d (measurement range Irg: 1000 A), the type of current probes 2 to be connected to the averaging unit 3 are specified based on the estimated current value I1. In the present embodiment, since the measured wire 6 is branched as described above into the three branch paths 6a, 6b, and 6c, the type of current probes 2 to be used is specified with the premise that three current probes 2 of the same type will be used.

As one example in the present embodiment, it is assumed that the estimated current value I1 of the measuring apparatus 1 is 1100 A. In this case, the current value I1 is eleven times the measurement range Irg of 100 A, over five but less than six times the measurement range Irg of 200 A, over two times but less than three times the measurement range Irg of 500 A, and over one times but less than two times the measurement range Irg of 1000 A. The measured wire 6 is branched into three as described above. For the above conditions, in the present embodiment, the current probes 2c with the measurement range Irg of 500 A are specified as the current probes 2 to be used and three current probes 2c of such type are used.

Note that when the estimated current value I1 of the measured current I is 550 A, the current value I1 is over five but less than six times the measurement range Irg of 100 A, over two times but less than three times the measurement range Irg of 200 A, over one times but less than two times the measurement range Irg of 500 A, and less than one times the measurement range Irg of 1000 A. In this case, the current probes 2b with the measurement range Irg of 200 A are specified as the current probes 2 to be used and three current probes 2b of such type are used. As a different configuration to that depicted in FIG. 1, when the measured wire 6 is branched into four branch paths and the estimated current value I1 of the measured current I is 1900 A, the current value I1 is nineteen times the measurement range Irg of 100 A, over nine times but less than ten times the measurement range Irg of 200 A, over three times but less than four times the measurement range Irg of 500 A, and over one times but less than two times the measurement range Irg of 1000 A. The measured wire 6 is branched into four as described above. For the above conditions, the current probes 2c with the measurement range Irg of 500 A are specified as the current probes 2 to be used and four current probes 2c of such type are used.

Next, three of the specified current probes 2c are connected to the two sensor connectors 21a and 21b of the averaging unit 3 and also one out of the other two sensor connectors 21c and 21d aside from such two sensor connectors 21a and 21b. As one example in the present embodiment, as depicted in FIG. 1, the current probe 2c is connected to the sensor connector 21c out of the two sensor connectors 21c and 21d. The operation lever of the on/off switch 32c connected between the sensor connector 21c and the buffer unit 33 is manually operated to switch on the on/off switch 32c. Since a current probe 2c is not connected to the sensor connector 21d, the operation lever of the on/off switch 32d connected between the sensor connector 21d and the buffer unit 33 is manually operated to switch off the on/off switch 32d. Note that when a current probe 2c is connected to the sensor connector 21d instead of the sensor connector 21c, the on/off switch 32c connected between the sensor connector 21c and the buffer unit 33 is switched on and the on/off switch 32*d* connected between the sensor connector 21*d* and the buffer unit 33 is switched off.

The output unit 25 of the averaging unit 3 is connected to one out of the input units 41*a*, 41*b*, and 41*c* of the measuring apparatus main unit 4 (in the present embodiment, as depicted in FIG. 1, the input unit 41*a*). After this, as depicted in FIG. 1, the current sensors 11 of the current probes 2*c* are clamped (attached) to the branch paths 6*a*, 6*b*, and 6*c* respectively.

In the present embodiment, the measured current I flowing in the measured wire 6 branches and flows as branch currents Ia, Ib, and Ic on the three branch paths 6*a*, 6*b*, and 6*c*. In this case, the current values Ia1, Ib1, and Ic1 of the branch currents Ia, Ib, and Ic are substantially the same value (since the current value I1 of the measured current I in the present embodiment is 1100 A, the current values Ia1, Ib1, and Ic1 are approximately 367 A, which is within the measurement range Irg (a value of 500 A) of the current probes 2*c*). The current sensors 11 of the current probes 2*c* detect the branch currents Ia, Ib, and Ic flowing on the branch paths 6*a*, 6*b*, and 6*c* to which the current probes 2*c* have been respectively attached and output the detection voltage signals S1*a*, S1*b*, and S1*c*.

By doing so, as depicted in FIG. 1, the detection voltage signals S1*a*, S1*b*, and S1*c* are inputted via the sensor connectors 21*a*, 21*b*, and 21*c* connected to the current probes 2 (in this example, the current probes 2*c*) into the averager 22 of the averaging unit 3. At the averager 22, only the other ends of the voltage dividing resistors 31*a*, 31*b*, and 31*c* that are connected to the sensor connectors 21*a*, 21*b*, and 21*c* into which the detection voltage signals S1*a*, S1*b*, and S1*c* are inputted are commonly connected and the voltage dividing resistor 31*d* that is connected to the sensor connector 21*d*, into which no detection voltage signal S1*d* is inputted due to no current probe 2 being connected, is separated from the other voltage dividing resistors 31*a*, 31*b*, and 31*c* by the on/off switch 32*d*. Accordingly, the averager 22 generates the averaged signal S2 (=(S1*a*+S1*b*+S1*c*)/3) for the detection voltage signals S1*a*, S1*b*, and S1*c* and outputs the averaged signal S2 while avoiding the influence of noise and the like that may be received by circuitry from the sensor connector 21*d* to the voltage dividing resistor 31*d*. The buffer unit 33 also outputs the averaged signal S2 with an unchanged amplitude as a new averaged signal S3 with a low output impedance via the cable 27 to the output unit 25.

As depicted in FIG. 1, the connection information Dc and the range information Dr are inputted via the sensor connectors 21*a*, 21*b*, and 21*c* to which the current probes 2 are connected into the probe information outputting unit 24 of the averaging unit 3. More specifically, the voltage L as the connection information Dc is inputted into the probe information outputting unit 24 via the connection pins PN3 of the sensor connectors 21*a*, 21*b*, and 21*c*. Since the current probes 2*c* are connected as the current probes 2 in this example, as depicted in FIG. 3, the voltages L and H are outputted as the range information Dr from the probe connecting portion 12 of a current probe 2 to the connection pins PN4 and PN5 of the sensor connector 21*a*. Accordingly, the range information Dr with this content is inputted via the sensor connector 21*a* into the probe information outputting unit 24.

Based on the inputted connection information Dc, the probe information outputting unit 24 outputs, via the cable 27 to the output unit 25, the number information Dn showing the number of sensor connectors 21 (in this example, the number three) to which current sensors 11 (that is, the current probes 2) are connected. The probe information outputting unit 24 outputs the inputted range information Dr (i.e., information showing that the connected current probes 2 are the current probes 2*c*) without amendment via the cable 27 to the output unit 25.

At the measuring apparatus main unit 4, the averaged signal S3 is inputted into the A/D convertor unit 42*a* via the input unit 41*a* to which the output unit 25 is connected. In this case, since the averaged signal S3 is obtained by averaging the detection voltage signals S1 outputted by detecting the branch currents Ia1, Ib1, and Ic1 (in this example, approximately 367 A) that are in the range of the respective measurement ranges Irg (in this example, 500 A) of the current probes 2*c*, the averaged signal S3 itself is also a voltage value in the range of the measurement range Irg. Accordingly, at the measuring apparatus main unit 4, which is typically used in an arrangement where current probes 2*a* to 2*d* are directly connected to the respective input units 41, the A/D convertor unit 42*a* correctly converts the averaged signal S3 to the waveform data Dia (in this example, averaged data) while avoiding saturation (i.e., without reaching a saturated state) and outputs the waveform data Dia to the processing unit 43.

Also, at the measuring apparatus main unit 4, the number information Dn and the range information Dr are inputted via the input unit 41*a* into the processing unit 43. The processing unit 43 executes a measurement process based on the waveform data Dia outputted from the A/D convertor unit 42*a* and the number information Dn and the range information Dr.

In this measurement process, the processing unit 43 first calculates the voltage value (as one example, the effective voltage value) of the averaged signal S3 based on the waveform data Dia. When doing so, the processing unit 43 specifies the voltage value of one bit of the waveform data Dia (that is, one bit corresponding to the resolution of the A/D convertor unit 42*a*) based on the range information Dr (that is information showing the measurement range Irg of the current probes 2*c*) and calculates the current value (as one example, the effective current value) of the averaged signal S3 shown by the waveform data Dia based on the specified one-bit current value. Here, the calculated current value of the averaged signal S3 is the current value of the branch currents flowing on approximately one branch path out of the three branch paths 6*a*, 6*b*, and 6*c*. From an opposite viewpoint, the current value of a combined current produced by combining such branch currents is the current value I1 of the measured current I.

For this reason, the processing unit 43 then multiplies the calculated current value by the value shown by the number information Dn (i.e., the number of current probes 2 connected to the averaging unit 3) to calculate the current value I1 of the measured current I flowing in the measured wire 6. Finally, the processing unit 43 displays the calculated current value I1 on the display unit and ends the measurement process.

Also, although not illustrated, in the measuring apparatus 1 the measuring apparatus main unit 4 is equipped with a function for directly connecting a voltage probe or the like to another input unit 41 aside from the input unit 41 to which the output unit 25 of the averaging unit 3 has been connected and having the processing unit 43 measure the voltage value of a voltage applied to the measured wire 6 or for directly connecting another current probe 2 and having the processing unit 43 measure the current value of the current flowing in another measured object. The processing unit 43 is also equipped with a function for measuring power supplied via the measured wire 6 based on the measured current value I1 of the measured current I and the measured voltage value of the voltage applied to the measured wire 6.

In this way, the averaging unit 3 is equipped with the plurality of sensor connectors 21 to which current probes 2, which have current sensors 11 and can also be connected to the input units 41 of the measuring apparatus main unit 4, can be connected, the averager 22 that generates the averaged signal S2 for two or more detection voltage signals S1 outputted from the current sensors 11 connected to two or more sensor connectors 21, and the output unit 25 that outputs the averaged signal S2 (in the example described above, the averaged signal S3 that has the same amplitude as the averaged signal S2).

Accordingly, with the averaging unit 3, by connecting the output unit 25 to one input unit 41 of the measuring apparatus main unit 4, it is possible to have the measuring apparatus main unit 4 measure the measured current I of the current value I1 (the current flowing in the measured wire 6) that exceeds the measurement range Irg of the current probes 2 (i.e., that exceeds the current value that can be measured by the current probes 2) using a method where the measured wire 6 is branched into a plurality of branch paths (in the present embodiment, the branch paths 6a, 6b, and 6c) while suppressing the used number of input units 41 provided in the measuring apparatus main unit 4 to a minimum (i.e., one).

Also, with the measuring apparatus 1 equipped with this averaging unit 3, it is possible, while measuring the current value I1 of the measured current I flowing in the measured wire 6 with the measuring apparatus main unit 4 based on the waveform data Di (averaged data) using a method of measuring that branches the measured wire 6 into a plurality of branch paths (in the example described above, the three branch paths 6a, 6b, and 6c), to make use of the remaining input units 41 and connect a voltage probe or another current probe 2 to such input units 41, which makes it possible for example to have the measuring apparatus main unit 4 measure the voltage value of a voltage applied to the measured wire 6 using such voltage probe and/or simultaneously have the measuring apparatus main unit 4 measure power or the like supplied via the measured wire 6 based on the measured current value I1 and the voltage value.

According to the averaging unit 3, it is possible to have the measuring apparatus main unit 4 automatically output the number information Dn showing the number of sensor connectors 21 to which the current probes 2 with the current sensors 11 are connected (that is, the number of current probes 2 connected to the averaging unit 3). By doing so, with a measuring apparatus 1 equipped with this averaging unit 3, in a situation where the range information Dr of the current probes 2 is known at the processing unit 43 of the measuring apparatus main unit 4 (as examples, a case where, like the measuring apparatus 1 in the present embodiment, the range information Dr is outputted from the averaging unit 3 to the processing unit 43 of the measuring apparatus main unit 4, and a case where the range information Dr is manually inputted into the processing unit 43), it is possible to measure the current value I1 of the measured current I based on the averaged signal S2, the number information Dn, and the known range information Dr while omitting the burden of manually inputting the number information Dn into the measuring apparatus main unit 4.

According to the averaging unit 3, it is also possible to have the range information Dr of the current sensors 11 (i.e., the current probes 2 that include such current sensors 11) connected to the sensor connectors 21 automatically outputted to the measuring apparatus main unit 4. By doing so, with an measuring apparatus 1 equipped with this averaging unit 3, in a situation where the number of current probes 2 connected to the averaging unit 3 is known (as examples, a case where, like the measuring apparatus 1 in the present embodiment, the number information Dn is outputted from the averaging unit 3 to the processing unit 43 of the measuring apparatus main unit 4, and a case where the number information Dn is manually inputted into the processing unit 43), it is possible to measure the current value I1 of the measured current I based on the averaged signal S2, the range information Dr, and the known number of current probes 2 while omitting the burden of manually inputting the range information Dr into the measuring apparatus main unit 4.

Also, with the averaging unit 3, the buffer unit 33 that has an input terminal set at a high input impedance and the same number of voltage dividing resistors 31a to 31d as the sensor connectors 21a to 21d that are set at the same resistance value and are disposed between the corresponding sensor connectors 21a to 21d and an input terminal of the buffer unit 33 (in the present embodiment the non-inverting input terminal of the operational amplifier 33a) are provided, at least one voltage dividing resistor 31 (in the present embodiment, the two voltage dividing resistors 31c and 31d) out of the voltage dividing resistors 31a to 31d are connected between the corresponding sensor connectors 21c and 21d and an input terminal of the buffer unit 33 having been connected in series with the on/off switches 32c and 32d, and other voltage dividing resistors (in the present embodiment, the two voltage dividing resistors 31a and 31b) aside from the at least one voltage dividing resistor are connected between the corresponding sensor connectors 21a and 21b and the input terminal of the buffer unit 33 in a solitary state.

Accordingly, with the averaging unit 3, the sensor connectors 21a and 21b to which the voltage dividing resistors 31a and 31b are connected in a solitary state are always connected to current sensors 11 (more specifically, to current probes 2) and the sensor connectors 21c and 21d to which the voltage dividing resistors 31c and 31d are connected having been connected in series with the on/off switches 32c and 32d are connected as necessary to current sensors 11 (more specifically, to current probes 2). By switching the on/off switch 32c or the on/off switch 32d to an off state, it is possible to separate a voltage dividing resistor 31, to which a current sensor 11 (that is, a current probe 2) is not connected (i.e., a voltage dividing resistor 31 into which no detection voltage signal S1 is inputted), and an input resistor 28 (the voltage dividing resistor 31c and input resistor 28c pair or the voltage dividing resistor 31d and input resistor 28d pair) from the voltage dividing resistors 31 and the input resistors 28 that are connected to current sensors 11 (more specifically, to the current probes 2) (that is, voltage dividing resistors 31 into which the detection voltage signals S1 are inputted). This means that it is possible, with a simple configuration, to correctly generate the averaged signal S3 for the detection voltage signals S1 inputted into the averaging unit 3 from the current sensors 11.

Note that the configurations of the averaging unit 3 and the measuring apparatus main unit 4 are not limited to the configurations described above. As examples, although the averaging unit 3 described above uses a configuration where the averaging unit 3 automatically outputs the number information Dn and the range information Dr for the current probes 2 into the measuring apparatus main unit 4 (more specifically, into the processing unit 43 of the measuring apparatus main unit 4), it is also possible to use a configuration where only one of the number information Dn and the range information Dr is automatically outputted and the other is manually inputted into the measuring apparatus main unit 4 and a configuration where the outputting of the number information Dn and the range information Dr from the averaging unit 3 to the measuring apparatus main unit 4 is not performed and such information is manually inputted into the measuring apparatus main unit 4. Even when such a configuration is used, by using an averaging unit 3 of such configuration, it is possible to have the measuring apparatus main unit 4 measure the measured current I with a current value I1 that exceeds the measurement range Irg of the current probes 2 using a method that branches the measured wire 6 into a plurality of branch paths while suppressing the used number of input units 41 provided in the measuring apparatus main unit 4 to a minimum (i.e., one). Even with a measuring apparatus that uses this configuration, by making use of remaining input units and connecting a voltage probe or other current probe to such input units, it is possible for example to have the measuring apparatus main unit measure the voltage value of a voltage applied to a current path using such voltage probes and/or simultaneously have the measuring apparatus main unit measure power or the like supplied via the current path based on the measured current value and the voltage value.

Although the averaging unit 3 described above uses a configuration where switches (for example, toggle switches) that are manually switched on and off are used as the on/off switches 32c and 32d, it is also possible to use a configuration where the on/off switches 32c and 32d are constructed of relays, analog switches, and the like and the probe information outputting unit 24 automatically switches the on/off switches 32c and 32d on and off based on the connection information Dc which is outputted from the sensor connectors 21c and 21d to the probe information outputting unit 24 when current probes 2 are connected. According to this configuration, it is possible to omit the burden of switching the on/off switches 32c and 32d on and off through manual operations.

Also, although the averaging unit 3 described above uses a configuration where on/off switches 32c and 32d are respectively connected in series to the voltage dividing resistors 31c and 31d so that when current probes 2 are not connected to the sensor connectors 21c and 21d, the voltage dividing resistors 31c and 31d connected to such sensor connectors 21c and 21d can be separated from the other voltage dividing resistors 31a and 31b, when, for example, at least the part of the circuit from the sensor connectors 21 to the averager 22 is unlikely to be affected by external noise, such as by being shielded inside the main case 26, problems that may occur due to the other ends of the voltage dividing resistors 31c and 31d, which become open at the first end when current probes 2 are not connected to the sensor connectors 21c and 21d, always being commonly connected to the other end of other voltage dividing resistors 31a and 31b are avoided. Accordingly, when such configuration is used, it is possible to omit the input resistors 28 and since the on/off switches 32c and 32d become unnecessary in such case, it is possible to use a configuration that omits the on/off switches 32c and 32d and has all of the voltage dividing resistors 31 (in the example described above, the four voltage dividing resistors 31a to 31d) connected in a solitary state between the connection pin PN1 of the corresponding sensor connectors 21 and the input terminal (the non-inverting input terminal of the operational amplifier 33a) of the buffer unit 33.

Also, although the averaging unit 3 described above uses a configuration where the output unit 25 is connected via the cable 27 to the main case 26, it is also possible to use a configuration where the output unit 25 is directly disposed on the main case 26 without the cable 27 in between (i.e., without using the cable 27) and as one example, to use a configuration where averaging unit 3 is tightly attached to the part of the measuring apparatus main unit 4 where the input unit 41 is disposed by connecting the output unit 25 to the input unit 41 (that is, a configuration where the averaging unit 3 is integrally provided on the measuring apparatus main unit 4).

What is claimed is:

1. An averaging unit, which is formed separately from a measuring apparatus main body and is connected to the measuring apparatus main body, comprising: a plurality of sensor connectors to which current sensors are detachably connected; an averager that generates an averaged signal for at least two detection voltage signals outputted from the current sensors connected to the sensor connectors; and a first connector that outputs the averaged signal and is detachably connected to one second connector of the measuring apparatus main body, the averaged signal being outputted to the measuring apparatus main body via the first connector and the second connector.

2. The averaging unit according to claim 1,
wherein the averaging unit outputs number information showing a number of the sensor connectors to which the current sensors are connected to the measuring apparatus main body.

3. The averaging unit according to claim 1,
wherein the averaging unit outputs range information showing a measurement range of the current sensors connected to the sensor connectors.

4. The averaging unit according to claim 2,
wherein the averaging unit outputs range information showing a measurement range of the current sensors connected to the sensor connectors.

5. The averaging unit according to claim 1,
wherein input resistors that set an input impedance for the current sensors are connected to the sensor connectors,
the averager includes a buffer including an input terminal set at a high input impedance and an output terminal that is connected to the first connector; and an equal number of voltage dividing resistors to the sensor connectors, each voltage dividing resistor being set at the same resistance value and being connected between a corresponding sensor connector and the input terminal, and
at least one voltage dividing resistor out of the voltage dividing resistors is connected between the sensor connector and the input terminal in a state where the voltage dividing resistor is connected in series to a switch, and other voltage dividing resistors, aside from the at least one voltage dividing resistor, are connected between the sensor connector and the input terminal in a solitary state.

6. The averaging device according to claim 2,
wherein input resistors that set an input impedance for the current sensors are connected to the sensor connectors,
the averager includes a buffer including an input terminal set at a high input impedance and an output terminal that is connected to the first connector; and an equal number of voltage dividing resistors to the sensor connectors, each voltage dividing resistor being set at the same resistance value and being connected between a corresponding sensor connector and the input terminal, and at least one voltage dividing resistor out of the voltage dividing resistors is connected between the sensor connector and the input terminal in a state where the voltage dividing resistor is connected in series to a switch, and other voltage dividing resistors, aside from the at least one voltage dividing resistor, are connected between the sensor connector and the input terminal in a solitary state.

7. The averaging device according to claim 3, wherein input resistors that set an input impedance for the current sensors are connected to the sensor connectors, the averager includes a buffer including an input terminal set at a high input impedance and an output terminal that is connected to the first connector; and an equal number of voltage dividing resistors to the sensor connectors, each voltage dividing resistor being set at the same resistance value and being connected between a corresponding sensor connector and the input terminal, and at least one voltage dividing resistor out of the voltage dividing resistors is connected between the sensor connector and the input terminal in a state where the voltage dividing resistor is connected in series to a switch, and other voltage dividing resistors, aside from the at least one voltage dividing resistor, are connected between the sensor connector and the input terminal in a solitary state.

8. The averaging device according to claim 4, wherein input resistors that set an input impedance for the current sensors are connected to the sensor connectors, the averager includes a buffer including an input terminal set at a high input impedance and an output terminal that is connected to the first connector and an equal number of voltage dividing resistors to the sensor connectors, each voltage dividing resistor being set at the same resistance value and being connected between a corresponding sensor connector and the input terminal, and at least one voltage dividing resistor out of the voltage dividing resistors is connected between the sensor connector and the input terminal in a state where the voltage dividing resistor is connected in series to a switch, and other voltage dividing resistors, aside from the at least one voltage dividing resistor, are connected between the sensor connector and the input terminal in a solitary state.

9. A measuring apparatus, comprising:

the measuring apparatus main body and the averaging unit according to claim 1, which is formed separately from the measuring apparatus main body and is connected to the measuring apparatus main body, wherein the measuring apparatus main body includes the second connector;

an A/D convertor that carries out A/D conversion on the averaged signal outputted from the second connector and outputs averaged data; and a processor, and wherein the processor executes a calculating process that calculates, based on the averaged data, a current value of a combined current produced by combining currents flowing on at least two current paths to which the current sensors have been attached.

10. A measuring apparatus, comprising:

the measuring apparatus main body and the averaging unit according to claim 2, which is formed separately from the measuring apparatus main body and is connected to the measuring apparatus main body, wherein the measuring apparatus main body includes the second connector;

an A/D convertor that carries out A/D conversion on the averaged signal outputted from the second connector and outputs averaged data; and a processor, and wherein the processor executes a calculating process that calculates, based on the averaged data and the number information, a current value of a combined current produced by combining currents flowing on at least two current paths to which the current sensors have been attached.

11. A measuring apparatus, comprising:

the measuring apparatus main body and the averaging unit according to claim 3, which is formed separately from the measuring apparatus main body and is connected to the measuring apparatus main body, wherein the measuring apparatus main body includes the second connector;

an A/D convertor that carries out A/D conversion on the averaged signal outputted from the second connector and outputs averaged data; and a processor, and wherein the processor executes a calculating process that calculates, based on the averaged data and the range information, a current value of a combined current produced by combining currents flowing on at least two current paths to which the current sensors have been attached.

12. A measuring apparatus, comprising:

the measuring apparatus main body and the averaging unit according to claim 4, which is formed separately from the measuring apparatus main body and is connected to the measuring apparatus main body, wherein the measuring apparatus main body includes the second connector;

an A/D convertor that carries out A/D conversion on the averaged signal outputted from the second connector and outputs averaged data; and a processor, and wherein the processor executes a calculating process that calculates, based on the averaged data and the range information, a current value of a combined current produced by combining currents flowing on at least two current paths to which the current sensors have been attached.

13. The averaging unit according to claim 2, wherein the plurality of sensor connectors are each configured to output connection information that shows that the current sensors are connected to the sensor connectors when the current sensors are connected, and the averaging unit comprises a probe information outputter that automatically outputs the number information to the measuring apparatus main body based on the connection information outputted from the plurality of sensor connectors.

* * * * *